(12) United States Patent
Dunn et al.

(10) Patent No.: US 6,597,050 B1
(45) Date of Patent: Jul. 22, 2003

(54) METHOD OF CONTACTING A SILICIDE-BASED SCHOTTKY DIODE AND DIODE SO FORMED

(75) Inventors: James Stuart Dunn, Jericho, VT (US); Peter Brian Gray, Essex Junction, VT (US); Kenneth Knetch Kieft, III, Essex Junction, VT (US); Nicholas Theodore Schmidt, Colchester, VT (US); Stephen St. onge, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/574,810

(22) Filed: May 19, 2000

Related U.S. Application Data

(62) Division of application No. 09/312,945, filed on May 17, 1999.

(51) Int. Cl.[7] .......................... H01L 31/00; H01L 23/48; H01L 23/52; H01L 29/40
(52) U.S. Cl. ....................... 257/453; 257/454; 257/452; 257/455; 257/757; 257/758
(58) Field of Search ................................ 257/453, 454, 257/750–759, 487

(56) References Cited

U.S. PATENT DOCUMENTS

| | | | |
|---|---|---|---|
| 3,906,540 A | | 9/1975 | Hollins |
| 4,063,964 A | | 12/1977 | Peressini et al. |
| 4,261,095 A | | 4/1981 | Dreves et al. |
| 4,278,985 A | | 7/1981 | Stobbs |
| 4,476,157 A | | 10/1984 | Shinozaki |
| 4,481,041 A | | 11/1984 | Müller |
| 4,513,309 A | | 4/1985 | Cricchi |
| 4,742,377 A | | 5/1988 | Einthoven |
| 4,795,722 A | * | 1/1989 | Welch et al. ................ 437/192 |
| 4,859,616 A | | 8/1989 | Losehand et al. |
| 4,862,244 A | | 8/1989 | Yamagishi |
| 4,874,714 A | | 10/1989 | Eklund |
| 4,899,199 A | | 2/1990 | Gould |
| 5,021,840 A | * | 6/1991 | Morris ......................... 357/15 |
| 5,281,841 A | * | 1/1994 | Van Roozendaal et al. . 257/360 |
| 5,296,716 A | * | 3/1994 | Ovshinsky et al. ............ 257/3 |
| 5,478,764 A | | 12/1995 | Inoue |
| 5,539,237 A | | 7/1996 | Todd et al. |
| 5,614,755 A | | 3/1997 | Hutter et al. |
| 5,907,789 A | * | 5/1999 | Komatsu .................... 438/649 |
| 6,184,564 B1 | * | 2/2001 | Gould ......................... 257/486 |

* cited by examiner

Primary Examiner—Eddie Lee
Assistant Examiner—Jesse A. Fenty
(74) Attorney, Agent, or Firm—Schmeiser, Olsen & Watts; William D. Sabo

(57) ABSTRACT

A method of contacting a silicide-based Schottky diode including the step of providing a contact to the silicide that is fully bordered with respect to an internal edge of the guard ring area. A Schottky diode having silicide contacting a guard ring of the Schottky diode and a contact to the silicide that is fully bordered by silicide with respect to an internal edge of the guard ring.

12 Claims, 5 Drawing Sheets

METHOD OF CONTACTING A SILICIDE-BASED SCHOTTKY DIODE AND DIODE SO FORMED

This application is a divisional of Ser. No. 09/312,945, filed on May 17, 1999.

BACKGROUND OF THE INVENTION

1. Technical Field

The present invention relates generally to silicon-based diodes and in particular to a method of contacting a silicide-based Schottky diode and the diode so formed.

2. Related Art

Referring to FIG. 1, a prior art type silicon-based Schottky barrier diode 100 is shown. Schottky diode 100 includes a silicon P– substrate 103 having an N++ portion 104 therein which rises to form cathode area 108, and an N-type section 106 with a P+ guard ring area 112 to form the anode section of the Schottky diode. Insulating layers of silicon oxide 102, 110 may also be provided for masking and definition purposes. In order to form the Schottky barrier, silicide layers 114, 116, respectively, are formed over the cathode and anode sections, including guard ring area 112. Contacts 118 would be formed in subsequent layers for interlayer communication. Further background in the creation of a silicide/silicon Schottky diode is provided in U.S. Pat. No. 4,063,964 to Peressini et al., hereby incorporated by reference.

When contacting a silicide-based Schottky diode, care must be taken to ensure that the formation of a contact to the diode does not disrupt the silicide/silicon interface which forms the Schottky diode. This disruption may occur in a number of ways. First, overetch during contact formation may remove silicide material and change the physical and/or electrical characteristics of the silicide/silicon junction. Second, underetch, which can occur while trying to avoid overetch, can result in residual insulator films at the bottom of the contact. Third, thermal processing during contact formation can result in unwanted metallurgical reactions when dissimilar metals are used for the Schottky diode silicide and the contact (e.g., platinum silicide and titanium/tungsten contacts) or additional silicide formation can occur in the case where the same metal is used for the silicide and contacts (e.g., titanium silicide and titanium/tungsten contacts).

In the three problem situations above, the variability associated with typical manufacturing processes limit the reproducibility and stability of silicide-based Schottky diodes.

Related art processes have attempted to overcome the above problems in a number of ways. For instance, attempts at forming the Schottky diode contact without silicides have been attempted. Unfortunately, this approach has the disadvantage that the Schottky diode contact processing is different than contact processing in the rest of the semiconductor processing technology. Hence, costs and complexity are increased. Another approach has been to form the silicide during the contact metallization. This approach has the disadvantage that the silicide formed is not self-aligned for other devices. Both of the above approaches suffer from the disadvantage that they are incompatible with contact technologies which limit one or more of the dimensions of the contact, such as tungsten stud technologies where the contact is of fixed width in one dimension.

In view of the foregoing, there is a need in the art for a silicide-based Schottky diode formed such that the Schottky diode and, in particular the silicide/silicon interface, is not fouled by contact creating processes.

SUMMARY OF THE INVENTION

In a first general aspect of the invention is provided a method of contacting a silicide-based Schottky diode, comprising the steps of: providing a silicide layer over a guard ring area of the Schottky diode; and providing a contact to the silicide layer such that there is a region of the silicide layer between the contact and an internal edge of the guard ring area. Hence, a Schottky diode having a contact to the silicide layer that is bordered by a portion of the silicide layer with respect to an internal edge of the guard ring, is formed. The contact may be bordered or borderless with respect to the external edge of the guard ring. The method may be used in any bi-complementary metal-oxide semiconductor (BiCMOS) Bipolar or CMOS technologies, etc. where diffusions are silicided. In another aspect of the invention is provided an integrated circuit including the above-described Schottky diode and a method of forming an integrated circuit incorporating the processes of forming a Schottky diode described above.

By this invention, the Schottky diode is effectively decoupled from the contact metallurgy. In addition, since the silicide/silicon interface is formed by a high temperature annealing process it is atomically clean and thermally stable. As the contact metallurgy need only touch the silicide over the guard-ring area, the diode characteristics are not influenced by processes used to form the contact. Thus any etch or pre-clean steps may be used when defining the contact and/or any typical thermal anneals may be used to ensure good ohmic contact to the silicide without influencing the diode interface or its electrical characteristics.

The foregoing and other features and advantages of the invention will be apparent from the following more particular description of preferred embodiments of the invention.

BRIEF DESCRIPTION OF THE DRAWINGS

The preferred embodiments of this invention will be described in detail, with reference to the following figures, wherein like designations denote like elements, and wherein.

DESCRIPTION OF THE PREFERRED EMBODIMENTS

Although certain preferred embodiments of the present invention will be shown and described in detail, it should be understood that various changes and modifications may be made without departing from the scope of the appended claims. The scope of the present invention will in no way be limited to the number of constituting components, the materials thereof, the shapes thereof, the relative arrangement thereof, etc., and are disclosed simply as an example of the preferred embodiment.

Figure 1:
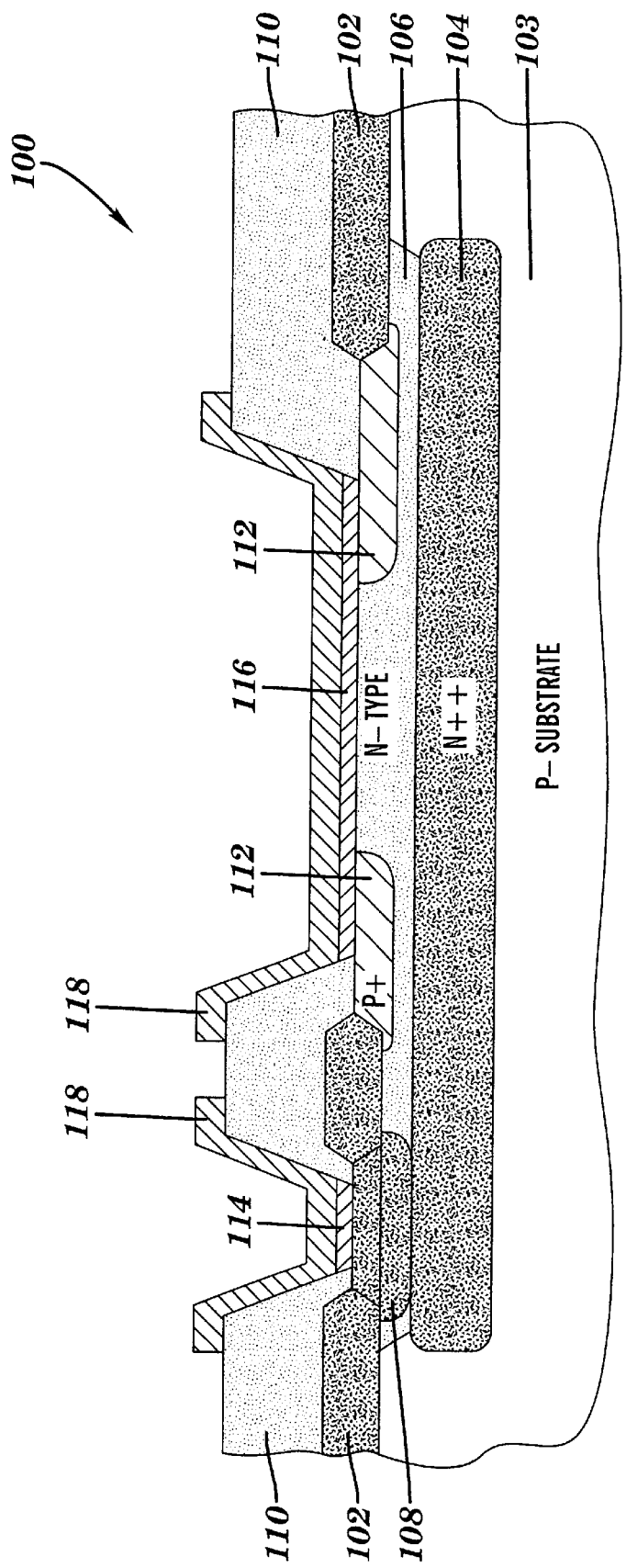
FIG. 1 shows a prior art type silicon-based Schottky barrier diode prior to contact formation.
Figure 2:
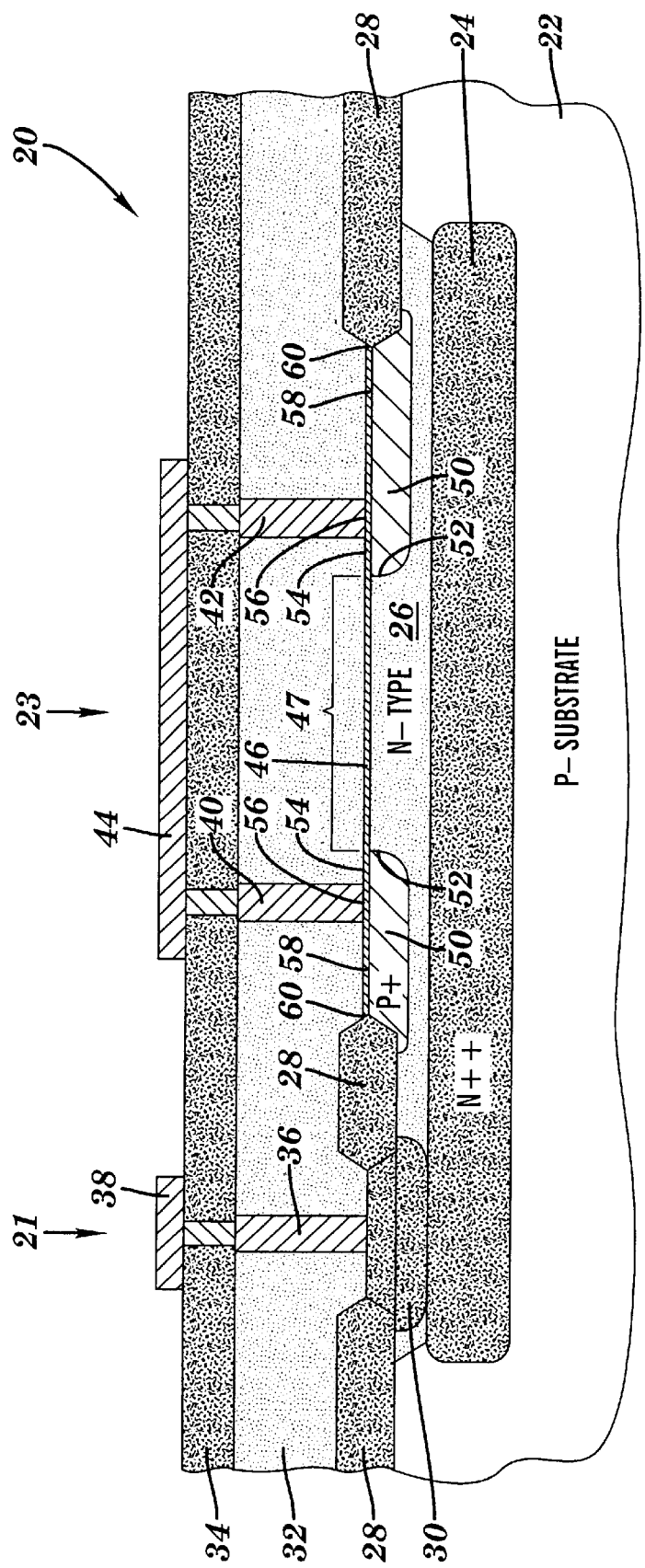
FIG. 2 shows a side view of a silicon-based Schottky diode in accordance with a first embodiment of the present invention.
Figure 3:
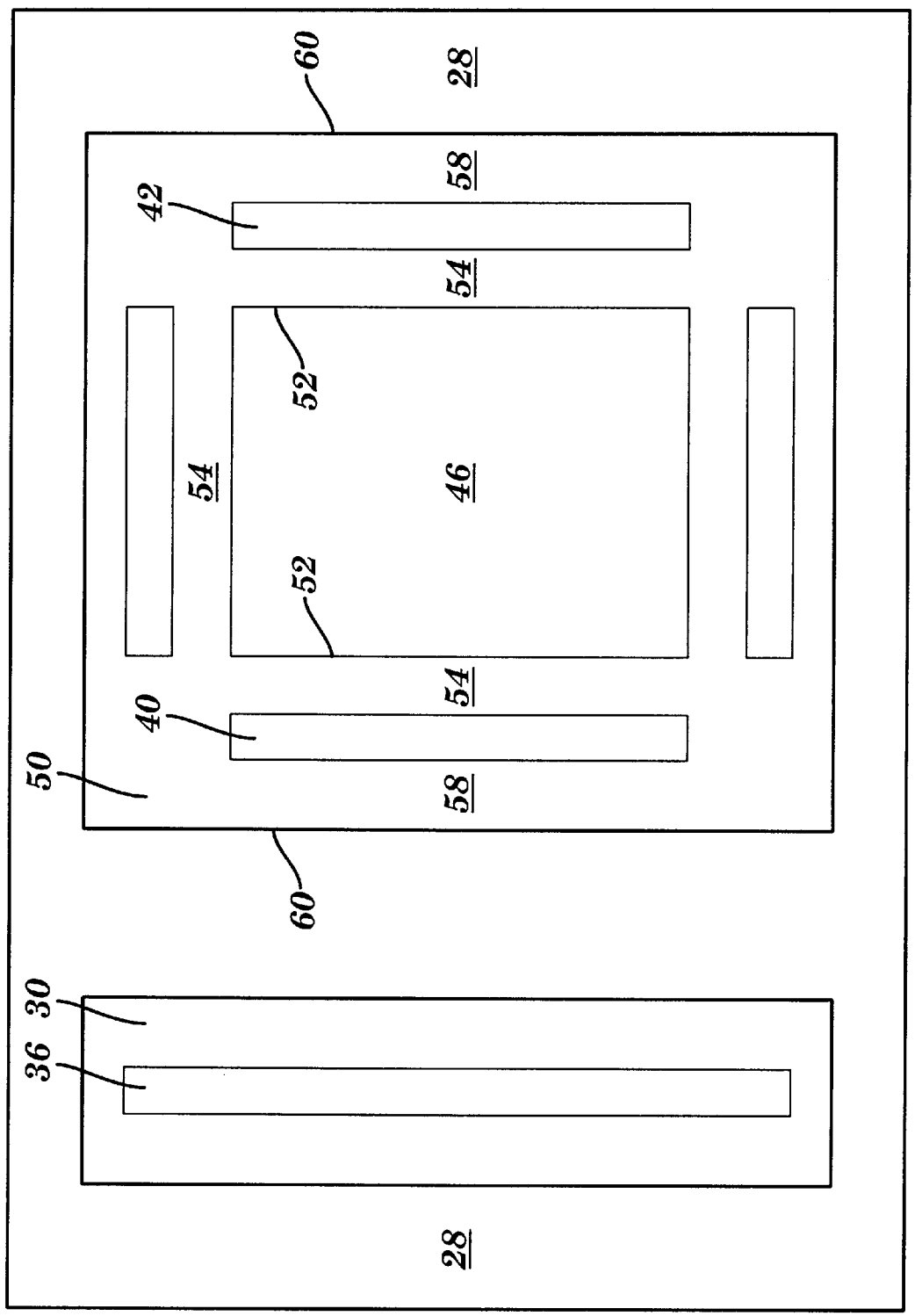
FIG. 3 shows a top view of a silicon-based Schottky diode in accordance with a first embodiment of the present invention.

Referring to FIGS. 2–3, a silicon-based Schottky diode 20 in accordance with a first embodiment of the present invention is shown. Schottky diode 20 includes a cathode area 21 and an anode area 23. Schottky diode 20 is formed of a P-doped silicon substrate 22. Within P-substrate 22 is an N++ doped silicon portion 24. N++ portion 24 rises through P-substrate 22 to form cathode portion 30 which can have its own contact 36 and metal layer 38 for communication to other components connected thereto. Silicon oxide portions 28 define the area around cathode area 21 and anode area 23.

In anode area 23, an N-type doped silicon portion 26 is provided above N++ portion 24. A guard ring area 50 of a P+ doped silicon surrounds the N-type portion 26 at a highest point thereof. The preceding described structures are provided by conventional processes.

Next, a layer of metal (not shown) laid over N-type portion 26 and guard ring area 50. A high temperature annealing process then follows to form silicide layer 46 and, hence, the silicide/silicon interface. The actual Schottky diode is formed by silicide layer 47 over N-type portion 26. Examples of suicides include but are not limited to: titanium silicide, cobalt silicide, platinum silicide or nickel silicide. Schottky diode 20 will have the characteristics of silicide layer 46.

As shown in FIG. 2, guard ring area 50 includes an internal edge 52 where guard ring area 50 meets N-type region 26 and an external edge 60 where it meets isolation silicon oxide 28. In accordance with the present invention, contact vias, or simply contacts, 40, 42 are contacted to silicide layer 46 over guard ring area 50 at surfaces 56 such that there is a portion or region 54 of silicide layer 46 between contacts 40, 42 and internal edge 52 of the guard ring 50. In other words, as best seen in FIG. 3, contacts 40, 42 are bordered by of an internal border portion or region 54 of silicide layer 46 with respect to an internal edge 52 of guard ring area 50. Examples of contact metals include but are not limited to: titanium, tungsten, tantalum or aluminum.

Contacts 40, 42 extend upwardly through various layer(s). For example, as shown, a tungsten local interconnect (or an mc level conductive layer) region 32, of e.g., poly-silicon glass, and an oxide layer 34, are shown. Contacts 40, 42 would also couple to metal layer 44 for connection to other components as is known in the art.

Figure 4:
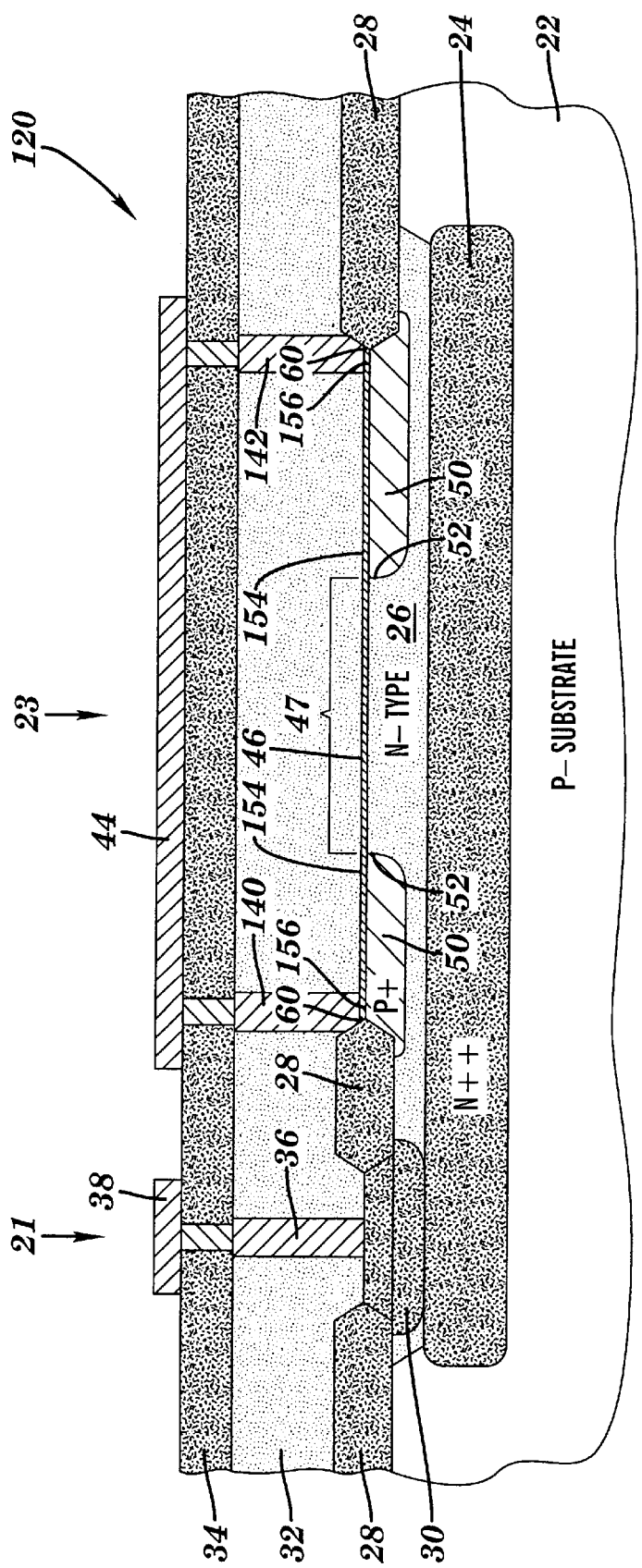
FIG. 4 shows a side view of a silicon-based Schottky diode in accordance with a second embodiment of the present invention.
Figure 5:
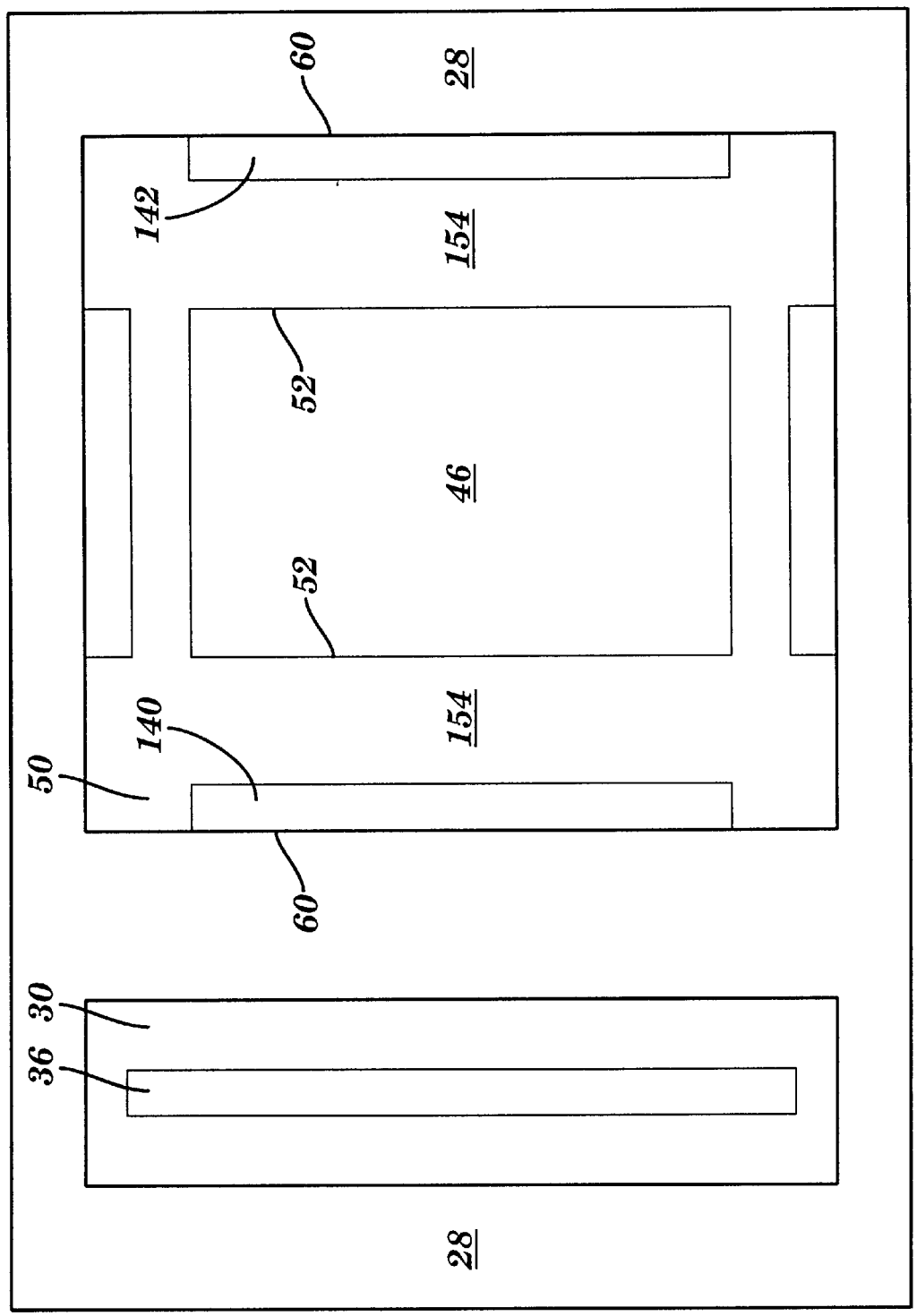
FIG. 5 shows a top view of a silicon-based Schottky diode in accordance with a second embodiment of the present invention

As also shown in FIGS. 2 and 3, there may also be regions or portions 58 of silicide layer 46 between contacts 40, 42 and external edge 60 of guard ring area 50, i.e., the edge 60 of guard ring 50 on the upper surface thereof that meets with isolation oxide 28. In other words, contacts 40, 42 may be bordered by portion or region 58 of silicide layer 46 over guard ring area 50 relative to external edge 60. In the alternative, as shown in FIGS. 4 and 5, contacts 140, 142 may contact guard ring area 50 at surfaces 156 without an area of silicide over guard ring area 50 between contacts 140, 142 and external edge 60. Hence, in this alternative embodiment, the Schottky diode only includes a region 154 of silicide layer 46 between contacts 140, 142 and internal edge 52 of guard ring area 50. It should also be recognized that contacts 40, 42 may be all one-piece if desired.

The processes and structure in accordance with the invention may be used in any bi-complementary metal-oxide semiconductor (BiCMOS), Bipolar, CMOS or other semiconductor technologies where diffusions are silicided. By this method of construction, Schottky diode 20 is effectively de-coupled from contact 40, 42 metallurgy. In addition, since the silicide/silicon interface is formed by a high temperature annealing process it is atomically clean and thermally stable. As contact 40, 42 metallurgy need only touch silicide layer 46 over guard ring area 50, diode 20 characteristics are not influenced by processes used to form contacts 40, 42. Thus any etch or pre-clean steps may be used when defining contact 40, 42 and/or any typical thermal anneals may be used to ensure good ohmic contact to silicide 46 without influencing diode 20 interface or its electrical characteristics.

The invention also includes an integrated circuit created with the above-described Schottky diode 20 therein and the process of forming an integrated circuit incorporating the above method of contacting a silicide-based Schottky diode.

While this invention has been described in conjunction with the specific embodiments outlined above, it is evident that many alternatives, modifications and variations will be apparent to those skilled in the art. Accordingly, the preferred embodiments of the invention as set forth above are intended to be illustrative, not limiting. Various changes may be made without departing from the spirit and scope of the invention as defined in the following claims.

For instance, while particular types of doped silicon have been disclosed for particular areas of the integrated circuit and Schottky diode, it is important to note that substitutions of the type of doping can be made as long as the types used are opposites as required for creation of the integrated circuit and Schottky diode.

We claim:

1. A Schottky diode having a silicide layer mechanically contacting a guard ring of the Schottky diode, the Schottky diode comprising:

a contact to the silicide layer that is bordered by a portion of the silicide layer with respect to an internal edge of the guard ring, wherein no portion of the suicide layer is disposed between the contact and an external edge of the guard ring area.

2. An integrated circuit comprising:

a Schottky diode having a silicide layer mechanically contacting a guard ring of the Schottky diode, and contact to the silicide layer such that there is a portion of the silicide layer between the contact and an internal edge of the guard ring, wherein no portion of the silicide layer is disposed between the contact and an external edge of the guard ring area.

3. An electrical structure comprising:

a Schottky diode that includes a silicide layer, wherein a first portion of the silicide layer is in mechanical contact with a guard ring area, and wherein a second portion of the silicide layer is not in mechanical contact with the guard ring area; and a first contact mechanically and electrically contacting the silicide layer such that the first contact is in contact with the first portion of the silicide layer and is not in contact with the second portion of the silicide layer, wherein no portion of the silicide layer is disposed between the first contact and an external edge of the guard ring area.

4. The electrical structure of claim 3, wherein the silicide layer includes a metal silicide selected from the group consisting of titanium silicide, cobalt silicide, platinum silicide, and nickel silicide.

5. The electrical structure of claim 3, wherein the Schottky diode further comprises a semiconductor layer, wherein the semiconductor layer is in mechanical contact with the second portion of the silicide layer and is not in mechanical contact with the first portion of the silicide layer.

6. The electrical structure of claim 5, wherein the semiconductor layer includes N− doped silicon, and wherein the guard ring includes P+ doped silicon.

7. The electrical structure of claim 6, wherein the Schottky diode further comprises a substrate having a first portion and a second portion, wherein the first portion of the substrate includes N++ doped silicon and is in mechanical contact with the semiconductor layer, and wherein the second portion of the substrate includes P− doped silicon and is in mechanical contact with the first portion of the substrate.

8. The electrical structure of claim 3, wherein the first contact comprises a metal selected from the group consisting of titanium, tungsten, tantalum, and aluminum.

9. An electrical structure comprising:
   a Schottky diode that includes a silicide layer, wherein a first portion of the silicide layer is in mechanical contact with the guard ring area, and wherein a second portion of the silicide layer is not in mechanical contact with the guard ring area; and
   a first contact mechanically and electrically contacting the silicide layer such that the first contact is in contact with the first portion of the silicide layer and is not in contact with the second portion of the silicide layer, and further comprising an electrically insulative layer and an electrically conductive layer, wherein the first contact passes through the electrically insulative layer and the electrically conductive layer, and wherein the first contact is in mechanical contact with both the electrically insulative layer and the electrically conductive layer.

10. The electrical structure of claim 9, further comprising a metal layer in mechanical and electrical contact with an end of the first contact, and wherein the end of the first contact is not in contact with the silicide layer.

11. The electrical structure of claim 9, further comprising a second contact mechanically and electrically contacting the silicide layer such that the second contact is not in contact with the first portion of the silicide layer and is in contact with the second portion of the silicide layer.

12. The electrical structure of claim 11, further comprising a metal layer in mechanical and electrical contact with both the first contact and the second contact.

\* \* \* \* \*